(12) United States Patent
Pan et al.

(10) Patent No.: US 8,291,291 B1
(45) Date of Patent: Oct. 16, 2012

(54) DATA RESEQUENCING

(75) Inventors: Zhengjun Pan, High Wycombe (GB); Suleyman Sirri Demirsoy, London (GB); Volker Mauer, Princes Risborough (GB); Kellie Marks, Ditchfield Common (GB)

(73) Assignee: Altera Corporation, San Jose, CA (US)

( * ) Notice: Subject to any disclaimer, the term of this patent is extended or adjusted under 35 U.S.C. 154(b) by 1007 days.

(21) Appl. No.: 12/291,695

(22) Filed: Nov. 13, 2008

(51) Int. Cl.
*G06F 11/00* (2006.01)
(52) U.S. Cl. ........................................ 714/756
(58) Field of Classification Search .............. None
See application file for complete search history.

(56) References Cited

U.S. PATENT DOCUMENTS

| | | | | |
|---|---|---|---|---|
| 5,815,421 | A * | 9/1998 | Dulong et al. | 708/520 |
| 6,845,482 | B2 * | 1/2005 | Yao et al. | 714/755 |
| 7,667,628 | B2 * | 2/2010 | Breiling | 341/81 |
| 2003/0221157 | A1 * | 11/2003 | Becker et al. | 714/756 |

OTHER PUBLICATIONS

Cheng, M. "A Decoder Architecture for High-Speed Free-Space Laser Communications," Proceedings of SPIE, Apr. 2005, vol. 5712, pp. 174-185.

* cited by examiner

*Primary Examiner* — Christopher McCarthy
(74) *Attorney, Agent, or Firm* — Mauriel Kapouytian & Treffert LLP; Ararat Kapouytian (57) ABSTRACT

Interleaving in which functions relating final and original positions are implemented with low complexity using inequalities based on the functions.

20 Claims, 7 Drawing Sheets

DATA RESEQUENCING

BACKGROUND

The invention relates to the concept of interleaving, which is used to help signal receivers overcome errors in acquired signals. For example, interleaving is applied to signals that are sent through the air interface in wireless telecommunications networks that comply with the Third Generation Partnership Program (3GPP) standards.

Generally speaking, interleaving, as performed by an interleaver, is the deliberate and reversible disordering of a sequence of information symbols. If a receiver acquires an interleaved signal in which an error affects a contiguous group of symbols, the error can be dispersed by reversing the interleaving, so-called "deinterleaving".

The ability to disperse an error is important when a transmitted information symbol sequence is prepared using forward error correction (FEC) coding that enables the resolution of an error in an acquired sequence provided that the error does not extend over too great a contiguous part of the acquired sequence. Turbo encoding is an example of FEC that is used within the 3GPP standards.

In a turbo encoder, a symbol sequence is supplied in parallel to both a first convolutional encoder and an interleaver. The interleaver produces an interleaved version of the sequence, which is then input to a second convolutional encoder. The outputs of the convolutional encoders are combined with the original sequence to provide the output of the turbo encoder. In a turbo decoder, a received turbo encoded sequence is used to prime a pair of constituent decoders. The output of a first one of the constituent decoders is interleaved and sent to the second constituent decoder for a further decoding iteration and the output of the second constituent decoder is deinterleaved and sent to the first constituent decoder for a further decoding iteration. The outputs of the first and second constituent decoders are exchanged several times prior to the emergence of a finally decoded sequence. Thus, where turbo coding is employed, considerable processing effort is devoted to interleaving, particularly in turbo decoding.

Several classes of interleaving algorithm exist. For example, a rectangular interleaver loads a symbol sequence into a memory block in a column-wise fashion and reads the symbols out in a row-wise fashion. Another type of interleaving is quadratic permutation polynomial (QPP) interleaving, which will be discussed after a brief reminder regarding some mathematical operations that feature in the remainder of this document:

the operation A mod B returns the remainder part of A divided by B.

the operation $\lfloor C \rfloor$ returns the largest integer value that is less than C.

A definition of QPP interleaving will now be provided.

Given a data sequence of length K symbols (where K has an integer value) and two parameters a and b that are dependent on K, the relationship between the position x of a symbol in the interleaved sequence and its position f(x) in the original sequence is:

$$f(x)=(ax+bx^2) \bmod K \qquad \text{Equation 1}$$

where x=0, 1, 2, 3, 4, ..., K-1.

It has been shown in "A Decoder Architecture for High-Speed Free-Space Laser Communications" (M. Cheng, M. Nakashima, J. Hamkins, B. Moision, and M. Barsoum, Proceedings of SPIE, vol. 5712, pp. 174-185, April 2005) that if we define:

$$g(x)=(a+b+2bx) \bmod K$$

then:

$$f(x+1)=(f(x)+g(x)) \bmod K$$

and $$g(x+1)=(g(x)+2b) \bmod K$$

The function g(x) is an auxiliary function whose purpose is to permit a recursive definition for f(x).

SUMMARY

According to one aspect, an embodiment of the present invention provides a method of interleaving a set of data items from an original order to an interleaved order, wherein the original and interleaved orders can be visualised respectively as an original array of data values and as an interleaved array of data values, both arrays being rectangular with P rows and M columns. The position in the original array from which should be provided the content of a location along a row of interleaved array is calculated. The abscissa and ordinate of the position under calculation are specified by respective first and second functions of the location along the interleaved array row. A basis of the first function is a first sum of a first pair of variable values, each being less than M. A basis of the second function is a second sum of second pair of variable values, each being less than P. The method further comprises determining the abscissa by reference to testing if the first sum is less than M and determining the ordinate by reference to testing if the second sum is less than P and by reference to testing if said first sum is less than M. Embodiments of the invention also encompass software and apparatus arranged to perform such a method.

Thus, an embodiment of the invention provides a way of performing such interleaving, which can avoid the use of computationally expensive division operations.

According to a further aspect, an embodiment of the invention provides a method of interleaving a series of K data items from an original order to an interleaved order. The method comprises calculating from which position in the original order should be provided the data item for a current position in the interleaved order. The position in the original order is specified by a first function, which is a function of the current position in the interleaved order and the basis of the first function is a sum of two variable values, each being less than K. A first one of these variable values is the value of the first function when its argument is the preceding position in the interleaved order and the second one of these variable values is the value of an auxiliary function when its argument is the preceding position in the interleaved order. The method further comprises calculating a first sum, which is a sum of the first variable value and a first constant, calculating a second sum, which is a sum of the second variable value and a second constant, and using the first and second sums to calculate a value for the auxiliary function when its argument is the current position in the interleaved order. In one embodiment, the first and second sums are calculated in parallel. Embodiments of the invention also encompass software and apparatus arranged to perform such a method.

Thus, an embodiment of the invention provides a way in which the data processing path in such an interleaving process can be shortened through the use of parallelisation.

According to another aspect, an embodiment of the invention provides a method of interleaving a set of data items from an original order to an interleaved order, wherein the original and interleaved orders can be visualised respectively as an original array of data items and as an interleaved array of data items, both arrays being rectangular with P rows and M columns. The method comprises calculating from which position in the original array should be provided the content of a current location along a row of the interleaved array. The abscissa and ordinate of the position are specified by respective first and second functions of the current location. A basis of the first function is a first sum of a first pair of variable values each being less than M and a basis of the second function is a second sum of second pair of variable values, each being less than P. A first of the variable values in the first pair is the value of the first function when its argument is the preceding position in the row and a second of the variable values in the first pair is the value of an auxiliary function when its argument is the preceding position in the row. The method further comprises calculating a first sum, which is a sum of the first variable value and a first constant, calculating a second sum, which is a sum of the second variable value and a second constant, and using said first and second sums to calculate a value for the auxiliary function when its argument is the current position in the row. In one embodiment, the first and second sums are calculated in parallel. Embodiments of the invention also encompass software and apparatus arranged to perform such a method.

Thus, an embodiment of the invention provides a way in which the data processing path in such an interleaving process can be shortened through the use of parallelisation.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
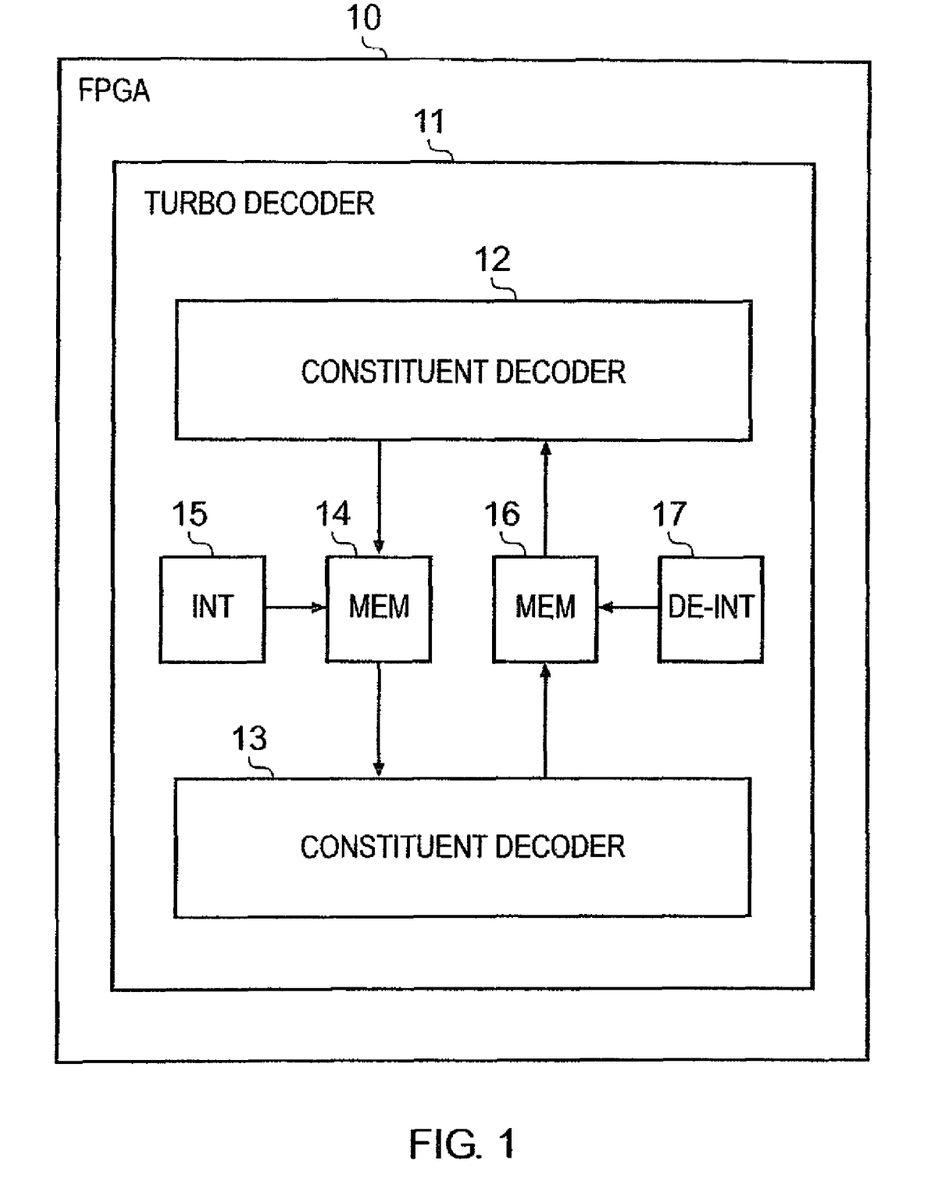
FIG. 1 is a block diagram schematically illustrating a field programmable gate array (FPGA) in which is implemented a turbo decoder design.

FIG. 1 shows an FPGA 10 forming part of a base station (not shown) of a 3GPP Long Term Evolution (LTE) network. A turbo decoder 11 is implemented in part of the FPGA 10 for the purpose of turbo decoding turbo encoded signals that have been demodulated from RF signals received by the base station.

As is well known in the field of digital communications, the turbo decoder 11 comprises first and second constituent decoders 12 and 13, each arranged to work on the re-ordered output of the other. The output sequence that constituent decoder 12 produces during an iteration of the turbo decoding process is stored into a memory 14. That sequence is then read from the memory 14 under the control of an interleaver 15 in order to provide the input sequence for constituent decoder 13 in the next iteration of the turbo decoding process. In a similar manner, the output sequence that constituent decoder 13 produces during an iteration of the turbo decoding process is stored into a memory 16. That sequence is then read from the memory 16 under the control of a deinterleaver 17 in order to provide the input to constituent decoder 12 for the next iteration of the turbo decoding process.

The sequence loaded into memory 14 from constituent decoder 12 arrives in memory 14 in a certain order, which shall hereinafter be referred to as the "original order". This signal is then read out from memory 14 in a different order, which shall hereinafter be called the "interleaved order", in accordance with a QPP interleaving algorithm (the deinterleaver 17 applies the reverse of this reordering operation). The interleaved order is obtained from the original order using the QPP interleaving algorithm mentioned earlier, in the "Background" section. That is to say, where the sequence to be interleaved is a block of K symbols, the relationship between the position x of a symbol in an original order and its position f(x) in the interleaved order is:

$$f(x) = (ax + bx^2) \bmod K$$

where:
x=0, 1, 2, 3, 4, . . . , K-1; and
a and b are dependent on K.

According to the aforementioned paper by Cheng et al, position f(x+1) can be deduced from position f(x) by:

$$f(x+1) = (f(x) + g(x)) \bmod K$$

where:

$$g(x) = (a + b + 2bx) \bmod K;$$

$$g(x+1) = (g(x) + 2b) \bmod K; \text{ and}$$

the initial conditions are f(0)=0 and g(0)=(a+b) mod K.

Figure 2:
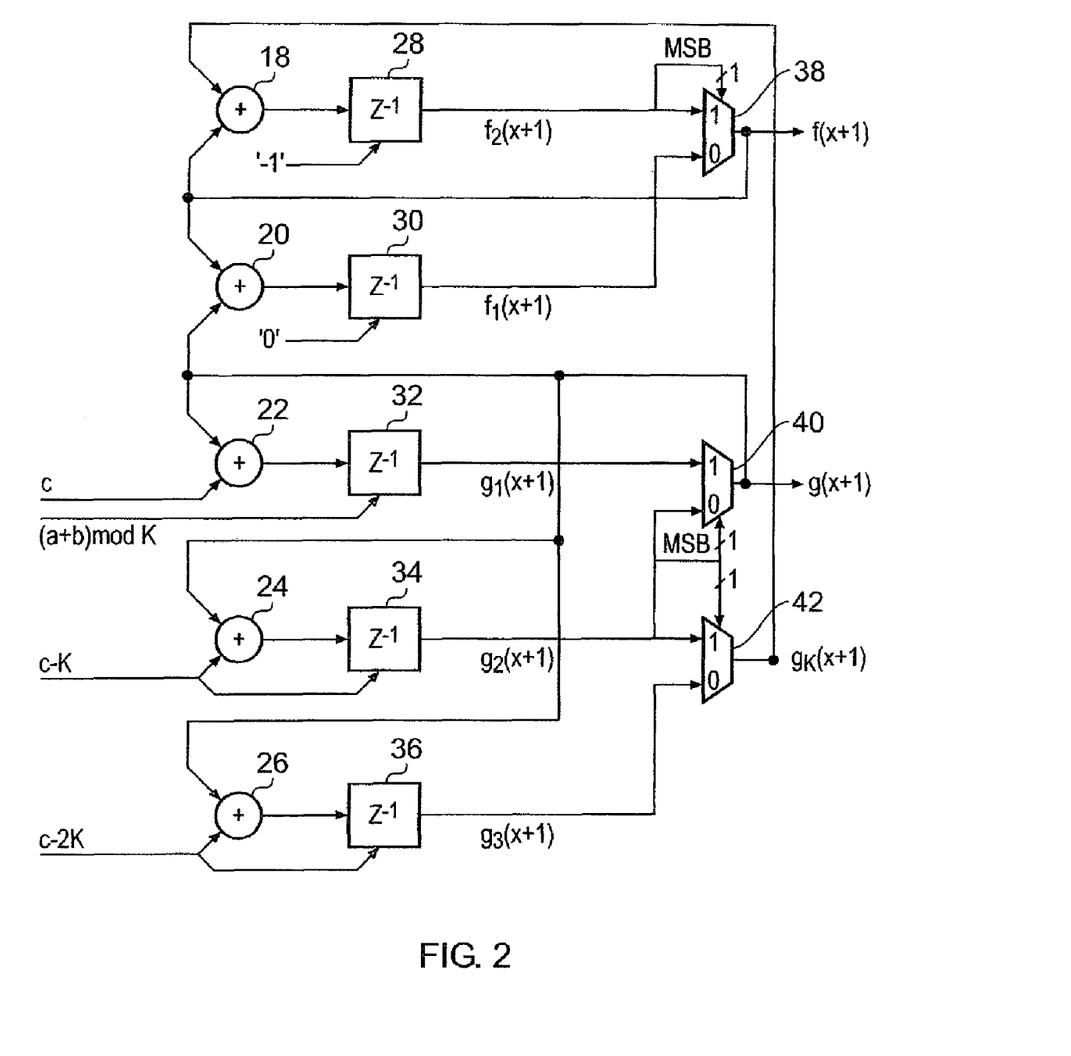
FIG. 2 illustrates schematically the hardware that is implemented within the FPGA of FIG. 1 for part of the interleaver that is shown within that figure.

A hardware implementation for the part of the interleaver 15 that deduces f(x+1) from f(x) and g(x) and which also deduces g(x+1) is shown in FIG. 2. The reasoning leading to the creation of that implementation will now be discussed, before then going on to describe the implementation itself.

First, for the sake of convenience, let us define c=2b mod K. The following values can be calculated:

$$f_1(x+1) = f(x) + g(x)$$

$$f_2(x+1) = f(x) + g(x) - K$$

$$g_1(x+1) = g(x) + c$$

$$g_2(x+1) = g(x) + c - K$$

Since $f(x)=(ax+bx^2)\mod K$, it follows that $f(x)<K$ always.
Since $g(x)=(a+b+2bx)\mod K$, it follows that $g(x)<K$ always.
Also, $c<K$. Therefore:
either $f_1(x+1)$ or $f_2(x+1)$ is less than K; and
either $g_1(x+1)$ or $g_2(x+1)$ is less than K.
More formally:

$$f(x+1) = \begin{cases} f_1(x+1) & \text{if } f_1(x+1) < K \\ f_2(x+1) & \text{else} \end{cases} \quad \text{Equation 2}$$

$$g(x+1) = \begin{cases} g_1(x+1) & \text{if } g_1(x+1) < K \\ g_2(x+1) & \text{else} \end{cases} \quad \text{Equation 3}$$

Thus, the FPGA 10 can be configured to implement the calculation of the values $f_1(x+1)$, $f_2(x+1)$, $g_1(x+1)$ and $g_2(x+1)$ and to evaluation of Equations 2 and 3, all without the multiplication and division operations that appear to be required by Equation 1.

The hardware implementation for the calculation of $f(x+1)$ that is shown in FIG. 2 is efficient in that it not only avoids the multiplication and division operations of Equation 1 but also avoids undesirable data path delays such as might arise from locating several arithmetic operations in series in a data path.

The digital circuit shown in FIG. 2 contains five adders 18 to 26, five registers 28 to 36 and three multiplexers 38 to 42, these elements being interconnected as shown in the diagram. One input of adder 22 is supplied with the value c, one input of the adder 24 is supplied with the value c-K, and one input of adder 26 is supplied with the value c-2K. The other inputs of the adders 18 to 26 are supplied by feedback paths. At initialisation, the registers 28 to 36 are loaded respectively with values −1, 0, (a+b)mod K, c-K and c-2K (these last three values and, indeed, the value c all being precalculated). These initial values are loaded using the synchronous load inputs of the registers 28 to 36, as indicated by the inputs leading into the lower faces of the registers. The control signal for multiplexer 38 is the most significant bit (MSB) of the output of register 28, whilst the MSB of the output of register 34 provides the control signal for both multiplexer 40 and multiplexer 42. The mathematical operations performed in the circuit of FIG. 2 will now be described.

The circuit of FIG. 2 calculates the following values:

$f_1(x+1)=f(x)+g(x)$—which is the output of register 30.

$f_2(x+1)=f(x)+g_K(x)$—which is the output of register 28.

$g_1(x+1)=g(x)+c$—which is the output of register 32.

$g_2(x+1)=g(x)+c-K$—which is the output of register 34.

$g_3(x+1)=g(x)+c-2K$—which is the output of register 36.

The values for $f(x+1)$ and $g(x+1)$ appear at the outputs of multiplexers 38 and 40, respectively.

Note that the definition of $f_2$ has been modified and that $g_3$ and $g_K$ have been introduced. The value $g_K$ appears at the output of the multiplexer 42 and is given by:

$$g_K(x+1) = \begin{cases} g_2(x+1) & \text{if } g_2(x+1) < K \\ g_3(x+1) & \text{if } g_2(x+1) \geq K \end{cases}$$

These changes avoid the "double addition" in $f(x)+g(x)-K$, which was the original formulation for $f(x+1)$.

Figure 3:
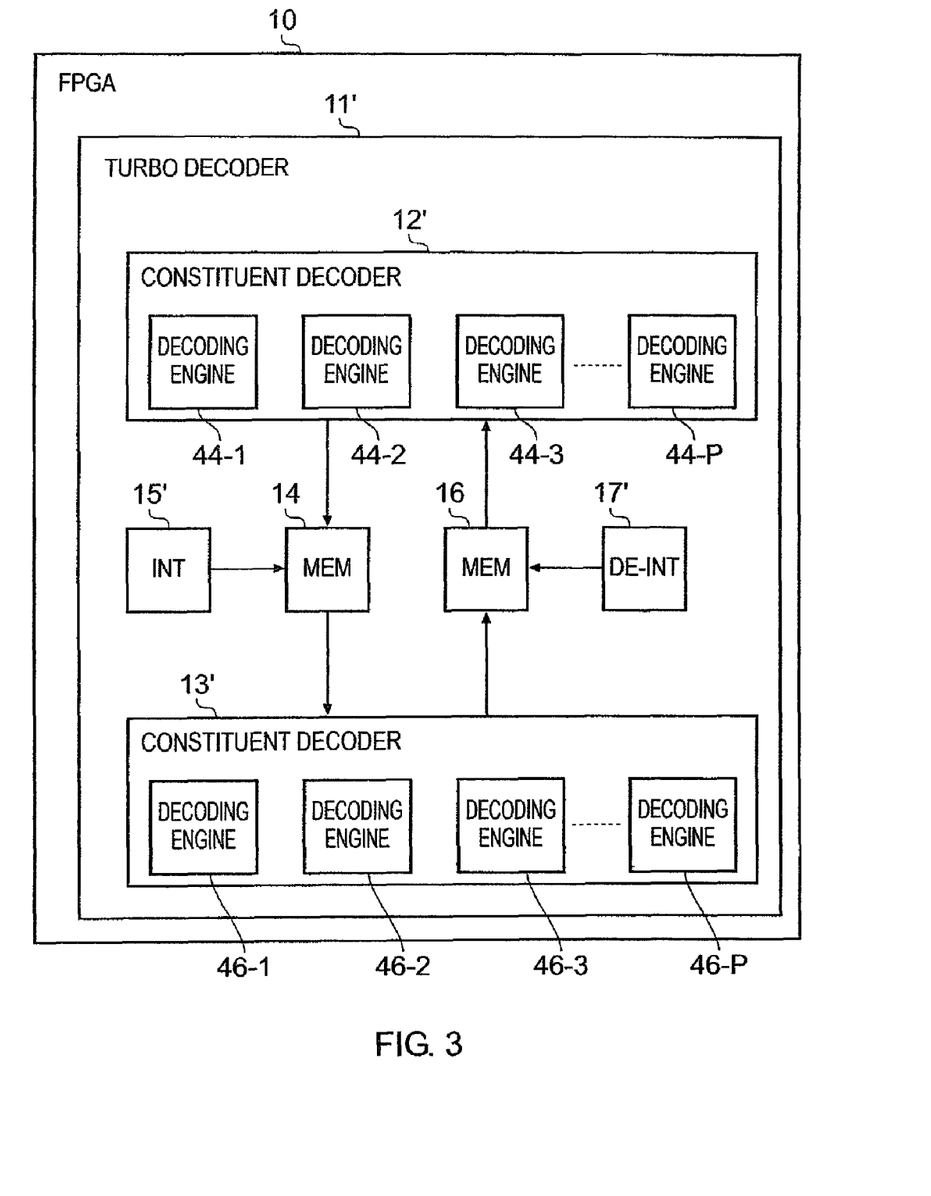
FIG. 3 is a block diagram illustrating the implementation within an FPGA of a different type of turbo decoder design.

A deinterleaver adapted to support a parallel block decoding within a turbo decoder will now be described, with reference to FIGS. 3 and 4.

It is well known that a sequence of symbols to be decoded by a constituent decoder (such as 12 or 13 in FIG. 1) in a turbo decoding iteration can be divided into sections such that each section can be decoded separately. Typically, such sections are decoded in parallel by respective decoding engines to achieve a significant decrease in the time required to decode the entire sequence. FIG. 3 illustrates the implementation of a modified turbo decoder 11' in the FPGA 10. Turbo decoder 11' differs from turbo decoder 11 in terms of the nature of the constituent decoders and the associated interleaves and deinterleaver.

The constituent decoder 12' contains P parallel decoding engines 44-1 to 44-P (where P has an integer value), each for decoding a section of the deinterleaved version of the sequence produced by the deinterleaver 17' reading from memory 16 the sequence produced by constituent decoder 13' in the previous turbo decoding iteration. The constituent decoder 13' contains P parallel decoding engines 46-1 to 46-P, each for decoding a section of the interleaved version of the sequence produced by the interleaver 15' reading from memory 14 the sequence produced by the constituent decoder 12' in the previous turbo decoding iteration. In reading symbols from memory 14, the interleaver 15' implements a version of QPP interleaving that supplies decoding engines 46-1 to 46-P in parallel with the sequence sections that they are to decode (and the deinterleaver 17' performs an analogous deinterleaving role for engines 44-1 to 44-P). As a precursor to describing the operation of the interleaver 15, a nomenclature for describing the arrangement of the symbols that are provided to the engines 44-1 to 44-P and 46-1 to 46-P will now be developed.

Figure 4:
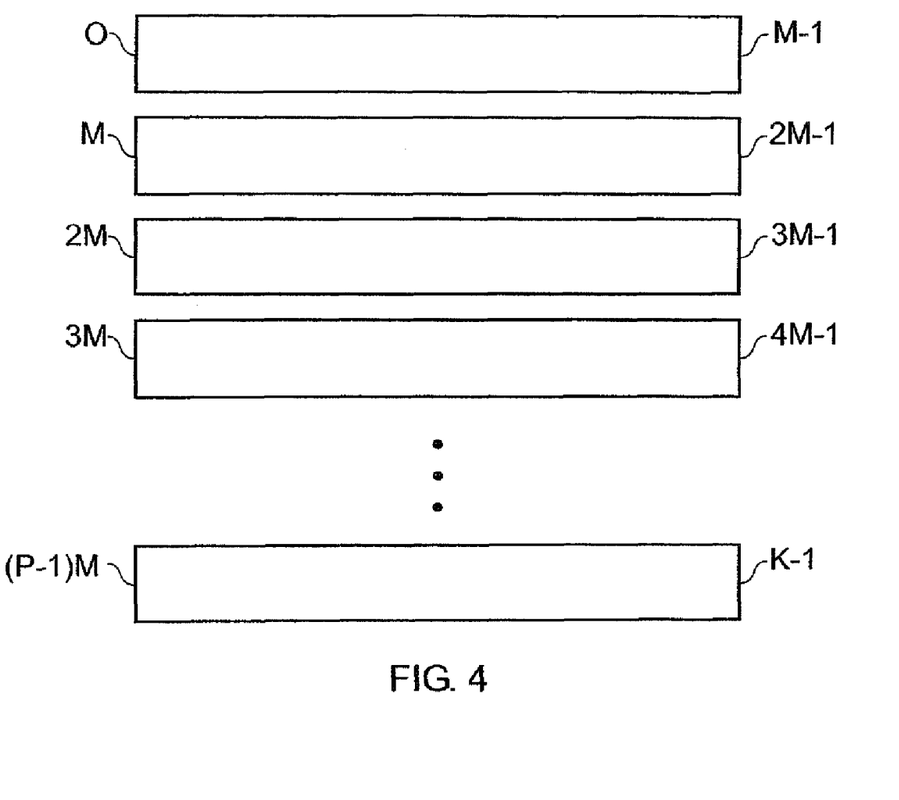
FIG. 4 illustrates the concept of reformatting a signal sequence as an array.

FIG. 4 shows the case where a sequence of length K symbols is divided into P sections, each of length M (=K/P) symbols (where M has an integer value), each section to be processed by a different one of engines 46-1 to 46-P. The first section consists of symbols 0 to M-1 from the sequence, the second section consists of symbols M to 2M-1 from the sequence, the third section consists of symbols 2M to 3M-1 from the sequence, and so on. In FIG. 4, the sections are arranged one below the other to form a two dimensional array of symbols, having both rows (running horizontally) and columns (running vertically). Each of the symbols in this array can be addressed by its row and column position.

Figure 5:
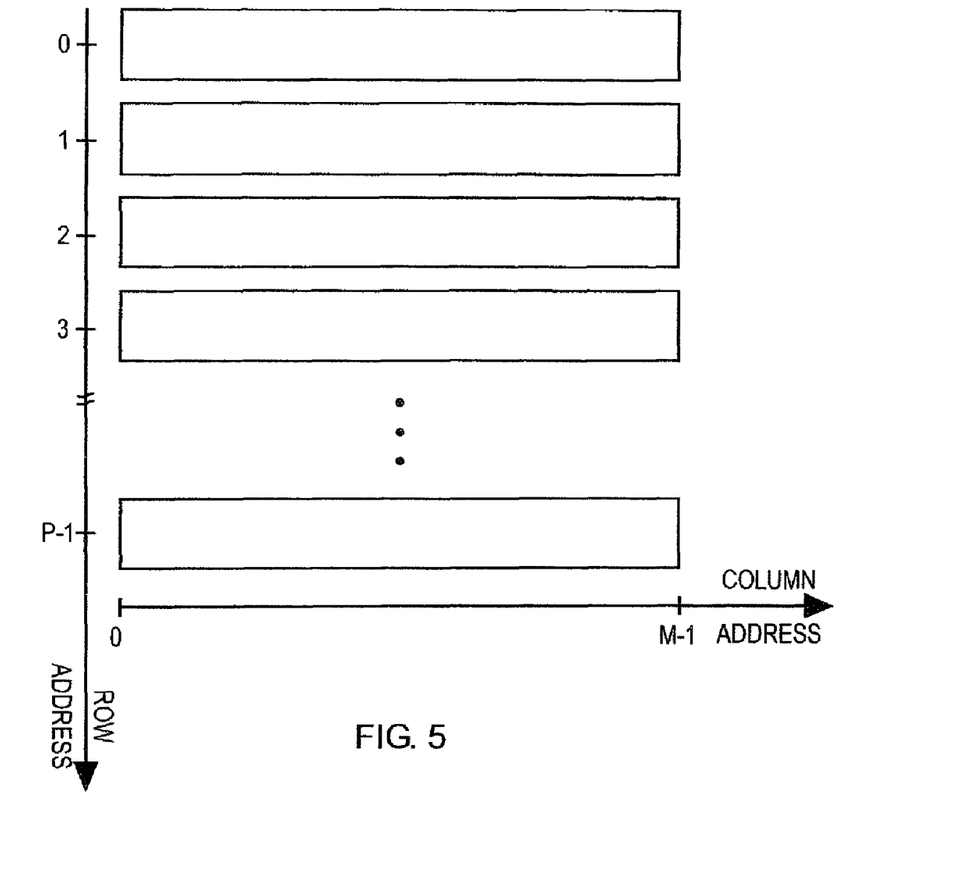
FIG. 5 shows the application of a column and row addressing scheme to the array of FIG. 4.

FIG. 5 shows the same array of symbols, but now each symbol in the array is addressed by its row and column positions (hereinafter called its "row address" and its "column address", respectively). For example, all symbols in the section running from symbol 0 to symbol M-1 have the row address 0 and all symbols in the section running from symbol 3M to 4M-1 have the row address 3. The first symbols of the sections all have the column address 0, the second symbols have the column address 1, the third symbols have the column address 2, and so on until the final symbols of the sections are reached, which all share the column address M-1.

Figure 6:
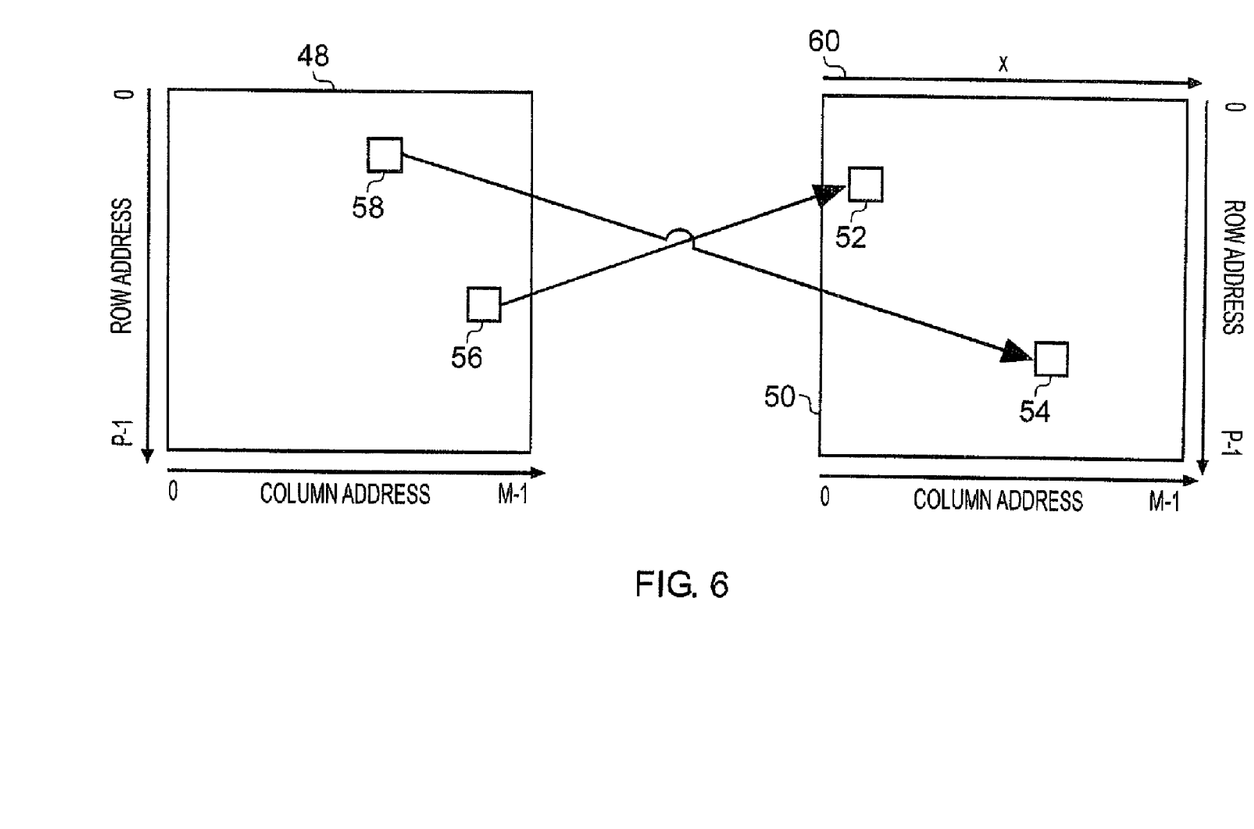
FIG. 6 illustrates the concept of interleaving an array formatted signal.

Over the course of a turbo decoding iteration, each of the engines 44-1 to 44-P produces an estimate of a section of the original order. These sections are shown in FIG. 6 formed into an array 48, whose elements are subject to the addressing scheme developed in FIG. 5. That is to say, each row in array 48 is the output of a respective one of the decoding engines 44-1 to 44-P. The data that populates this array is of course stored in memory 14. The content of that memory must be read out as sections of the interleaved order with each section being directed to a respective one of the parallel decoding engines 46-1 to 46-P. The sections of the interleaved order can likewise be formed into an array 50, again addressed using the convention developed in FIG. 5. The function of the interleaver 15' is to place the contents of the array 48 at their appropriate positions in the array 50 (and the deinterleaver 17' performs an analogous role for the data that needs to be read out of memory 16 for engines 44-1 to 44-P). Consider for example elements 52 and 54 in array 50, and assume that they lie in rows of array 50 corresponding to the sections that are input to engines 46-a and 46-b respectively. When the interleaver 15' is required to supply the content of element 52 to engine 46-a, the interleaver 15' supplies the content of the element of array 48 that is specified by the QPP interleaving algorithm, in this instance element 56. Likewise, when the interleaver 15' is required to supply the content of element 54 to engine 46-b, the interleaver 15' supplies the content of the element that is specified by the QPP interleaving algorithm, on this occasion element 58. The manner in which the interleaving is achieved will now be explained in mathematical terms.

According to the QPP algorithm set out earlier, the content for position x in the interleaved sequence is obtained from position f(x) in the original sequence. Given that the original sequence is now arranged as array 48 in FIG. 6, position f(x) can be expressed by co-ordinates consisting of a column address f'(x) and a row address f"(x) where:

$$f'(x) = f(x) \bmod M \qquad \text{Equation 4}$$

$$f''(x) = \lfloor f(x)/M \rfloor \qquad \text{Equation 5}$$

This can be stated another way as:

$$f(x) = f'(x) + Mf''(x) \qquad \text{Equation 6}$$

We can define a similar decomposition for g(x):

$$g(x) = g'(x) + Mg''(x) \qquad \text{Equation 7}$$

where:

$$g'(x) = g(x) \bmod M \qquad \text{Equation 8}$$

$$g''(x) = \lfloor g(x)/M \rfloor \qquad \text{Equation 9}$$

Where g'(x) and g"(x) are auxiliary functions too.
Given that f'(x+1)=f(x+1)mod M, we can substitute for f(x+1) to obtain:

$$f'(x+1) = [(f(x)+g(x)) \bmod K] \bmod M$$

Since M is a factor of K, this becomes:

$$f'(x+1) = (f(x)+g(x)) \bmod M$$

The definitions of f(x) and g(x) from Equations 6 and 7 can be substituted into the above equation to yield:

$$f'(x+1) = (f'(x)+Mf''(x)+g'(x)+Mg''(x)) \bmod M$$

but f"(x) and g"(x) are integer of course so the above result reduces to:

$$f'(x+1) = (f'(x)+g'(x)) \bmod M$$

Likewise, $$g'(x+1) = g(x+1) \bmod M$$

$$g'(x+1) = [(g(x)+2b) \bmod K] \bmod M$$

$$g'(x+1) = (g(x)+2b) \bmod M$$

$$g'(x+1) = (g(x) \bmod M + 2b \bmod M) \bmod M$$

$$g'(x+1) = (g'(x)+c') \bmod M$$

where c'=(2b)mod M.

Given that f"(x+1)=⌊f(x+1)/M⌋, we can substitute for f(x+1) to obtain:

$$f''(x+1) = \lfloor [(f(x)+g(x)) \bmod K]/M \rfloor$$

$$f''(x+1) = \lfloor [(f'(x)+Mf''(x)+g'(x)+Mg''(x)) \bmod K]/M \rfloor$$

$$f''(x+1) = \lfloor [(f'(x)+g'(x)+M(f''(x)+g''(x))) \bmod K]/M \rfloor$$

$$f''(x+1) = \lfloor (f'(x)+g'(x)+M(f''(x)+g''(x)))/M \rfloor \bmod \frac{K}{M}$$

$$f''(x+1) = \lfloor (f'(x)+g'(x))/M \rfloor \bmod P + (f''(x)+g''(x)) \bmod P$$

$$f''(x+1) = \lfloor (f'(x)+g'(x))/M \rfloor + (f''(x)+g''(x)) \bmod P$$

$$f''(x+1) = \lfloor (f'(x)+g'(x))/M \rfloor + (f''(x)+g''(x)) \bmod P$$

$$f''(x+1) = \begin{cases} (f''(x)+g''(x)) \bmod P & \text{if } f'(x)+g'(x) < M \\ 1+(f''(x)+g''(x)) \bmod P & \text{else} \end{cases}$$

Likewise, $$g''(x+1) = \lfloor g(x+1)/M \rfloor$$

$$g''(x+1) = \lfloor [(g(x)+2b) \bmod K]/M \rfloor$$

$$g''(x+1) = \begin{cases} (g''(x)+c'') \bmod P & \text{if } g'(x)+c' < M \\ 1+(g''(x)+c'') \bmod P & \text{else} \end{cases}$$

where c"=⌊(2b)/M⌋.

The quantities f"(x+1) and f'(x+1) are defined inductively. Therefore, x can be treated as a parameter that runs from 0 to M-1 along each row of array 50 as indicated by arrow 60 in FIG. 6, provided that the set of values f'(0), f"(0), g'(0) and g"(0) are given for the beginning of each row. These values can be calculated for all rows during the time it takes the FPGA 10 to be loaded with the data block that is to be interleaved. These values can be calculated by the configuration of FIG. 2 (which of course treats x as running from 0 to K-1 and does not utilise the array folding notion of FIGS. 4 to 6) and obtaining the values f(x) and g(x) for every instance where x satisfies x=nM, where n=0, 1, 2, 3, . . . , P-1. The set of values for the $n^{th}$ of these instances is the f(0) and the g(0) of the $n^{th}$ row of array 50. Then, f'(0), f"(0), g'(0) and g"(0) can be calculated by Equations 4, 5, 8 and 9 respectively.

Consider for example the $0^{th}$ row of the array 50. Since for that row f(0)=0 and g(0)=(a+b)mod K, we have:

$$f'(0) = f(0) \bmod M = 0 \bmod M = 0$$

$$f''(0) = \lfloor f(0)/M \rfloor = \lfloor 0/M \rfloor = 0$$

$$g'(0) = [(a+b) \bmod K] \bmod M = (a+b) \bmod M \text{(recall that } M \text{ is a factor of } K\text{)}$$

$$g''(0) = \lfloor g(0)/M \rfloor = \lfloor [(a+b) \bmod K]/M \rfloor$$

The procedure for calculating f'(x+1), f"(x+1), g'(x+1) and g"(x+1) from f'(x), f"(x), g'(x) and g"(x) within a row of the array 50 will now be described.

Since f'(x) must be smaller than M and since g'(x) must be smaller than M, it follows that f'(x)+g'(x) must be smaller than 2M. So, f'(x+1) must have one of the two following values:

$$f_1'(x+1) = f'(x) + g'(x) \quad \text{Equation 10}$$

$$f_2'(x+1) = f'(x) + g'(x) - M \quad \text{Equation 11}$$

Since f"(x) must be smaller than P and since g"(x) must be smaller than P, it follows that f"(x)+g"(x) must be smaller than 2P. So, one of the two following values must be smaller than P:

$$f_1''(x+1) = f''(x) + g''(x) \quad \text{Equation 12}$$

$$f_2''(x+1) = f''(x) + g''(x) - P \quad \text{Equation 13}$$

Since g'(x) must be smaller than M and since c' is smaller than M, it follows that g'(x)+c' must be smaller than 2M. So, one of the two following values must be smaller than M:

$$g_1'(x+1) = g'(x) + c' \quad \text{Equation 14}$$

$$g_2'(x+1) = g'(x) + c' - M \quad \text{Equation 15}$$

Since g"(x) must be smaller than P and since c" is smaller than P, it follows that g"(x)+c" must be smaller than 2P. So, g"(x+1) must have one of the two following values:

$$g_1''(x+1) = g''(x) + c'' \quad \text{Equation 16}$$

$$g_2''(x+1) = g''(x) + c'' - P \quad \text{Equation 17}$$

Therefore, $$f'(x+1) = \begin{cases} f_1'(x+1) & \text{if } f_1'(x+1) < M \\ f_2'(x+1) & \text{else} \end{cases} \quad \text{Equation 18}$$

$$f''(x+1) = \quad \text{Equation 19}$$
$$\begin{cases} f_1''(x+1) & \text{if } f_1''(x+1) < P \text{ and } f_1'(x+1) < M \\ f_1''(x+1)+1 & \text{if } f_1''(x+1) < P \text{ and } f_1'(x+1) \geq M \\ f_2''(x+1) & \text{if } f_1''(x+1) \geq P \text{ and } f_1'(x+1) < M \\ f_2''(x+1)+1 & \text{else} \end{cases}$$

$$g'(x+1) = \begin{cases} g_1'(x+1) & \text{if } g_1'(x+1) < M \\ g_2'(x+1) & \text{else} \end{cases} \quad \text{Equation 20}$$

$$g''(x+1) = \quad \text{Equation 21}$$
$$\begin{cases} g_1''(x+1) & \text{if } g_1''(x+1) < P \text{ and } g_1'(x+1) < M \\ g_1''(x+1)+1 & \text{if } g_1''(x+1) < P \text{ and } g_1'(x+1) \geq M \\ g_2''(x+1) & \text{if } g_1''(x+1) \geq P \text{ and } g_1'(x+1) < M \\ g_2''(x+1)+1 & \text{else} \end{cases}$$

Equations 10 to 21 can be implemented within FPGA 10 to produce an interleaver for determining the location in terms of ordinate or row f"(x) and abscissa or column f'(x) co-ordinates within array 48 whose content must be placed at position x of row n of array 50 (where row n is of course specified by the values assigned for f'(0), f"(0), g'(0) and g"(0)). However, the set of equations 10 to 21 can be modified to avoid, as before, delay associated with the occurrence of multiple arithmetic operations in series in a data path, in which case Equation 11 becomes:

$$f_2'(x+1) = f'(x) + g_M'(x) \quad \text{Equation 22}$$

And the following definitions can be made:

$$g_3'(x+1) = g'(x) + c' - 2M$$

$$g_M' = \begin{cases} g_2'(x+1) & \text{if } g_2'(x+1) < M \\ g_2'(x+1) & \text{if } g_2'(x+1) \geq M \end{cases}$$

Figure 7:
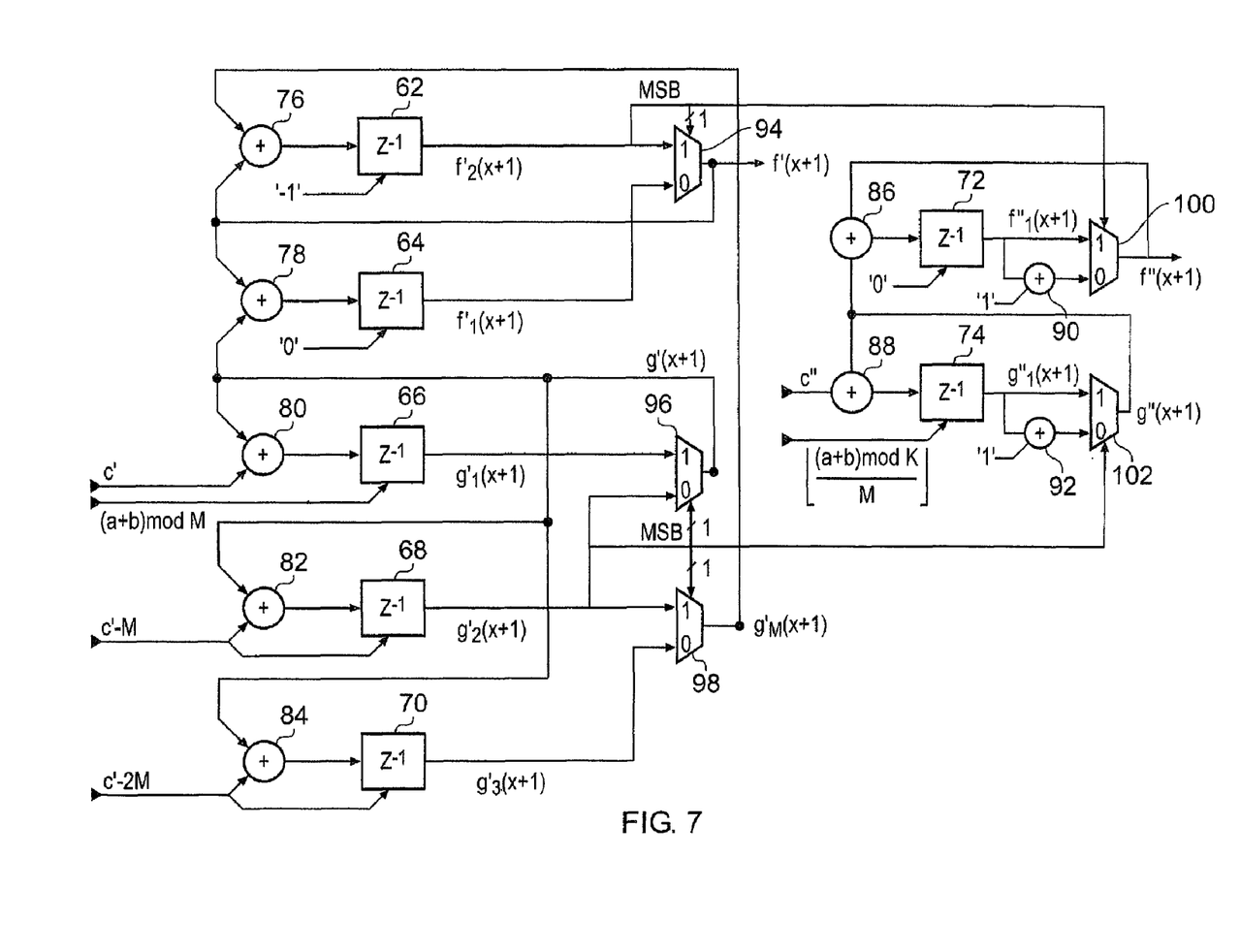
FIG. 7 illustrates schematically a part of the hardware design that is implemented within the FPGA of FIG. 3 to realise the interleaver of that figure.

The interleaver implementation for a row of array 50 is shown in FIG. 7. The circuit shown in that diagram comprises registers 62 to 74, adders 76 to 92 and multiplexers 94 to 102.

In the case where the interleaver design shown in FIG. 7 is being used to perform interleaving along the $0^{th}$ row of array 50, the registers 62 to 74 are initialised with the following values, respectively:

$$f_2'(0) = -1$$

$$f_1'(0) = 0$$

$$g_1'(0) = (a+b) \bmod M$$

$$g_2'(0) = c' - M$$

$$g_3'(0) = c' - 2M.$$

$$f_1''(0) = 0$$

$$g_1''(0) = \lfloor [(a+b) \bmod KJ/M \rfloor$$

These initial values are loaded using the synchronous load inputs of the registers 62 to 74, as indicated by the inputs leading into the lower faces of the registers. If the design of FIG. 7 is to be used to implement interleaving for some other row of array 50 then a different set of initialisation values will apply, and these can be calculated in the period when the data to be interleaved is being loaded. Besides initialisation inputs, the values c', c'-M, c'-2M and c" are provided to inputs of adders 80, 82, 84 and 88, respectively. Also one input of each of adders 90 and 92 is fixed with an input value of 1. FIG. 7 will not be discussed in great detail here since its organisation is evident from the drawing itself. However, some salient features will be touched upon, as follows. The multiplexers 96, 98 and 102 are all controlled by the MSB of the output of register 68. The multiplexers 94 and 100 are both controlled by the MSB of the output of register 62. The outputs of all of the multiplexers 94 to 102 are fed back into inputs of certain ones of the adders 76 to 88. The outputs of the circuit, f'(x+1) and f"(x+1), are taken from multiplexers 94 and 100, respectively.

The circuit of FIG. 7 can be used to calculate f'(x+1), f"(x+1), g'(x+1) and g"(x+1) for a given value of x for all rows n=0 to P-1. This is done by initialising the relevant registers of the circuit on the basis of the f'(0), f"(0), g'(0) and g"(0) values of the desired row, 0 through P-1 (the calculation of these values was described earlier). Therefore P parallel versions of the FIG. 7 circuit can be provided, each serving the interleaving needs of a different, respective one of the P rows of array 50. Depending on the precise nature of the QPP algorithm involved, it can be the case that f'(x+1) is the same for all P interleavers, with the result that the circuitry associated with calculating f'(x+1) can be omitted from P-1 of the P versions of the FIG. 7 circuit, with the result that a significant saving in FPGA resources is obtained.

In one embodiment, the data interleaved by an interleaver or method of the present invention represents communication signals that are produced or received by a communication device. In one embodiment, the data represents demodulated RF communication signals that are demodulated from RF communication signals received by a base station. It is to be noted that "representing communication signals" is herein used broadly to refer to both representing either the communication signals that are actually transmitted or some other signals derived therefrom (e.g., signals that are modulated or demodulated versions of the actually transmitted communication signals).

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An interleaver for interleaving a set of data items from an original order to an interleaved order, wherein:
   said original and interleaved orders can be visualised respectively as an original array of data items and as an interleaved array of data items, both arrays being rectangular with P rows and M columns;
   the interleaver is arranged to calculate from which position in the original array should be provided content of a location along a first row of the interleaved array;
   abscissa and ordinate of said position are specified by respective first and second functions of said location;
   a basis of the first function is a first sum of a first pair of variable values each being less than M;
   a basis of the second function is a second sum of second pair of variable values each being less than P; and
   the interleaver comprises:
   first logic for determining said abscissa by reference to testing if said first sum is less than M; and
   second logic for determining said ordinate by reference to testing if said second sum is less than P and by reference to testing if said first sum is less than M.

2. An interleaver according to claim 1, wherein one of said variable values in said first sum is the position abscissa in said original array of the position that provides the data item for the location along said first row preceding the one under calculation.

3. An interleaver according to claim 1, wherein the definition of said first function includes a first auxiliary function having as an argument the location along said first row and one of said variable values in said first sum is the value of said first auxiliary function evaluated for the location along said first row preceding the one under calculation.

4. An interleaver according to claim 1, wherein one of said variable values in said second sum is the position ordinate in said original array of the position that provides the data item for the location along said first row preceding the one under calculation.

5. An interleaver according to claim 1, wherein the definition of said second function includes a second auxiliary function having as an argument the location along said first row and one of said variable values is the value of said second auxiliary function evaluated for the location along said first row preceding the one under calculation.

6. An interleaver according to claim 1, wherein the interleaver is arranged to calculate from which position in the original array should be provided the content of a location along a second row of the interleaved array and the interleaver is arranged to use as the abscissa of that position the abscissa determined by said first logic for said first row.

7. An interleaver according to claim 1, further comprising memory arranged to contain said data items and wherein the interleaver is configured to calculate, during the time taken to load said data items into said memory, for at least one of the rows of the interleaved array the position in the original array from which should be provided the content of the start of the TOW.

8. An interleaver according to claim 1, wherein the interleaver is configured to deliver each row of the interleaved array as an input stream for another device.

9. A method of interleaving a set of data items from an original order to an interleaved order, wherein the set of data items represents communication signals, said original and interleaved orders can be visualised respectively as an original array of data values and as an interleaved array of data values, both arrays being rectangular with P rows and M columns; and the method comprises:
   calculating from which position in the original array should be provided content of a location along a first row of the interleaved array;
   and wherein:
   abscissa and ordinate of said position are specified by respective first and second functions of said location;
   a basis of the first function is a first sum of a first pair of variable values each being less than M;
   a basis of the second function is a second sum of second pair of variable values each being less than P; and
   the method further comprises:
   determining said abscissa by reference to testing if said first sum is less than M, wherein the determining said abscissa is performed by a first logic; and
   determining said ordinate by reference to testing if said second sum is less than P and by reference to testing if said first sum is less than M, wherein the determining said ordinate is performed by a second logic.

10. A method according to claim 9, wherein one of said variable values in said first sum is the position abscissa in said original array of the position that provides the data item for the location along said first row preceding the one under calculation.

11. A method according to claim 9, wherein the definition of said first function includes a first auxiliary function having as an argument the location along said first row and one of said variable values in said first sum is the value of said first auxiliary function evaluated for the location along said first row preceding the one under calculation.

12. A method according to claim 9, wherein one of said variable values in said second sum is the position ordinate in said original array of the position that provides the data item for the location along said first row preceding the one under calculation.

13. A method according to claim 9, wherein the definition of said second function includes a second auxiliary function having as an argument the location along said first row and one of said variable values is the value of said second auxiliary function evaluated for the location along said first row preceding the one under calculation.

14. A method according to claim 9, further comprising calculating from which position in the original array should be provided the content of a location along a second row of the interleaved array, wherein the abscissa of that position is obtained by re-using the abscissa determined for said first row.

15. A method according to claim 9, further comprising calculating for at least one of the rows of the interleaved array the position in the original array from which should be provided the content of the start of the row, wherein this calculation is conducted during a period in which said data values are loaded into a memory.

16. A method according to claim 9, further comprising delivering each row of the interleaved array as an input stream for another device.

17. An interleaver for interleaving a series of K data items from an original order to an interleaved order, wherein:
- the interleaver is arranged to calculate from which position in said original order should be provided the data item for a current position in the interleaved order;
- the position in the original order is specified by a first function, which is a function of the current position in the interleaved order;
- the basis of the first function is a sum of two variable values each being less than K;
- a first of said variable values is the value of the first function when its argument is the preceding position in the interleaved order;
- a second of said variable values is the value of an auxiliary function when its argument is the preceding position in the interleaved order; and
- the interleaver comprises:
- first logic arranged to calculate a first sum, which is a sum of the first variable value and a first constant;
- second logic arranged to calculate a second sum, which is a sum of the second variable value and a second constant; and
- third logic arranged to use said first and second sums to calculate a value for the auxiliary function when its argument is the current position in the interleaved order;
- wherein the first and second logic operate in parallel.

18. A method of interleaving a series of K data items from an original order to an interleaved order, the method comprising:
- calculating from which position in said original order should be provided the data item for a current position in the interleaved order;
- wherein:
- the series of K data items represents communication signals;
- the position in the original order is specified by a first function, which is a function of the current position in the interleaved order;
- the basis of the first function is a sum of two variable values each being less than K;
- a first of said variable values is the value of the first function when its argument is the preceding position in the interleaved order;
- a second of said variable values is the value of an auxiliary function when its argument is the preceding position in the interleaved order; and
- the method further comprises:
- calculating a first sum, which is a sum of the first variable value and a first constant, wherein the calculating the first sum is performed by a first logic;
- calculating a second sum, which is a sum of the second variable value and a second constant wherein the calculating the second sum is performed by a second logic; and
- using said first and second sums to calculate a value for the auxiliary function when its argument is the current position in the interleaved order;
- wherein the first and second sums are calculated in parallel.

19. An interleaver for interleaving a set of data items from an original order to an interleaved order, wherein:
- said original and interleaved orders can be visualised respectively as an original array of data items and as an interleaved array of data items, both arrays being rectangular with P rows and M columns;
- the interleaver is arranged to calculate from which position in the original array should be provided content of a current location along a row of the interleaved array;
- abscissa and ordinate of said position are specified by respective first and second functions of said current location;
- a basis of the first function is a first sum of a first pair of variable values each being less than M;
- a basis of the second function is a second sum of second pair of variable values each being less than P;
- a first of said variable values in said first pair is the value of the first function when its argument is the preceding position in said row;
- a second of said variable values in said first pair is the value of an auxiliary function when its argument is the preceding position in said row; and
- the interleaver comprises:
- first logic arranged to calculate a first sum, which is a sum of the first variable value and a first constant;
- second logic arranged to calculate a second sum, which is a sum of the second variable value and a second constant; and
- third logic arranged to use said first and second sums to calculate a value for the auxiliary function when its argument is the current position in said row;
- wherein the first and second logic operate in parallel.

20. A method of interleaving a set of data items from an original order to an interleaved order, wherein:
- the set of data items represents communication signals;
- said original and interleaved orders can be visualised respectively as an original array of data items and as an interleaved array of data items, both arrays being rectangular with P rows and M columns;
- the method comprises calculating from which position in the original array should be provided content of a current location along a row of the interleaved array;
- wherein:
- abscissa and ordinate of said position are specified by respective first and second functions of said current location;
- a basis of the first function is a first sum of a first pair of variable values each being less than M;
- a basis of the second function is a second sum of second pair of variable values each being less than P;
- a first of said variable values in said first pair is the value of the first function when its argument is the preceding position in said row;
- a second of said variable values in said first pair is the value of an auxiliary function when its argument is the preceding position in said row; and
- the method further comprises:
- calculating a first sum, which is a sum of the first variable value and a first constant, wherein the calculating the first sum is performed by a first logic;
- calculating a second sum, which is a sum of the second variable value and a second constant wherein the calculating the second sum is performed by a second logic; and
- using said first and second sums to calculate a value for the auxiliary function when its argument is the current position in said row;
- wherein the first and second sums are calculated in parallel.

\* \* \* \* \*